Oct. 30, 1956 J. MATEJKA Re. 24,231

CARBON DEPOSITING FURNACE

Original Filed Aug. 14, 1953 3 Sheets-Sheet 1

INVENTOR.
JOSEPH MATEJKA.
BY A. Hiram Stringer
Agent

CARBON DEPOSITING FURNACE

Original Filed Aug. 14, 1953 3 Sheets-Sheet 2

INVENTOR.
Joseph Matejka.
BY A. Hiram Stanger
agent

CARBON DEPOSITING FURNACE

Original Filed Aug. 14, 1953 3 Sheets-Sheet 3

INVENTOR.
Joseph. Matejka.
BY
A. Frank Stagger
Agent

United States Patent Office

Re. 24,231
Reissued Oct. 30, 1956

24,231

CARBON DEPOSITING FURNACE

Joseph Matejka, Columbus, Nebr., assignor to Dale Products, Inc., Columbus, Nebr.

Original No. 2,695,922, dated November 30, 1954, Serial No. 374,226, August 14, 1953. Application for reissue November 29, 1955, Serial No. 549,908

11 Claims. (Cl. 118—47)

Matter enclosed in heavy brackets [ ] appears in the original patent but forms no part of this reissue specification; matter printed in italics indicates the additions made by reissue.

This invention relates to carbon depositing furnace and particularly for the purpose of depositing carbon on ceramic blanks or rods in the manufacture of electrical resistors.

Heretofore it has been the practice to use large furnaces, sometimes as large as five feet by five feet to perform the same function done by the furnace of my invention, which is of the size of three common bricks, whereby it is less than eight inches in height and the major portion of it is only four inches in width. These dimensions can be varied within the principles of my invention.

The reason such furnaces have been so very large heretofore is because of what might be called a zone theory. It is known that it is necessary to prevent carbon depositing gases from reaching a ceramic rod before the rod has become heated. It has been the thought that if the rod moves in the furnace through various zones of heat and relative cold, with the cold zones being zones wherein there is no depositing, then the desired effect can be accomplished. The fallacy in this theory lies in that no sharp division between the cold and hot zones can be obtained without a barrier wall between them. The result is therefore a gradually varying temperature in the various positions the rod contacts on its way through the furnace.

Still other furnaces send streams of inert gases from both ends of a heating chamber toward the center and hottest portion of the chamber, thereby causing the hydrocarbon gas to be restricted to the center of the furnace, where coating takes place. However, without a barrier wall a sharp division between the carbon depositing gases and insert gas cannot be obtained.

It is therefore an object of this invention to provide wall means, preferably a cylindrical tube, for protecting the blank or rod from the carbon depositing gases except at one point in the travel of the rod through the furnace. This is best seen in Figure 2.

Great difficulty is experienced in the art of carbon deposits due to the complexity of all of the factors involved. The simplicity of the result obtained by the inventor and the ease with which he accomplishes carbon deposits on resistor rods is the result of more than a year of endeavor. The complexity of the problem will be appreciated upon examination of the furnaces now in use. It will thus be seen that the object of this invention is to provide a furnace which will obviate the difficulties of the present process.

A further object is to provide a furnace which will operate automatically and will not need the constant attention of an operator as earlier furnaces have. In earlier furnaces spot checks of the product are necessary in order to determine if the furnace is operating properly. It has heretofore been necessary to make such checks very frequently and often.

An object of this invention is to provide a furnace which can be operated by comparatively unskilled operators and the operation of which is so constant that this frequent spot check is made unnecessary.

A further object is to provide a furnace with a cracking chamber wherein the input is pulsating. This, however, while an important factor in itself can conceivably be a variable factor and that any sort of new or standard furnace might be adaptable to the essence of this invention.

A further object of the invention is to provide for propelling a ceramic rod through the furnace and depositing a carbon deposit thereon at one point only in its line of travel.

Another object of the invention is to provide a furnace wherein the thickness of the coating of the carbon deposit can be controlled easily by relatively unskilled operators merely by changing the rate of feed of the ceramic rods and by varying the rate of the pulsating inflow of hydrocarbon gas. This can be regulated by the proportions of mixture of hydrocarbon gas and inert gases.

In presently known devices the regulation of these factors has been highly complicated and could be accomplished only by highly skilled operators who are trained to carefully adjust a plurality of interrelated variables.

A further object is to provide a furnace in which uniform coating can be obtained without the necessity of expensive mechanisms for rotating the ceramic rod during depositing since the carbon deposit is made upon the rod in one point of its travel over a lateral distance on the rod and from all directions so that the circumferential surface is completely coated at this point, without rotation of the rod since the carbon deposit reaches it from all directions at once.

A further object of the invention is to introduce a furnace the gases of which are introduced from the top of the cracking unit and moved downwardly through the furnace. This is important because there is a tendency for the cracked or partially cracked gases to rise and form a back pressure in the cracking chamber. This back pressure helps control pressure in the cracking chamber.

Other and further objects and advantages of the present invention will be apparent from the following detailed description, drawings and claims, the scope of the invention not being limited to the drawings themselves, as the drawings are only for the purpose of illustrating a way in which the principles of this invention can be applied.

Other embodiments of the invention utilizing the same or equivalent principles may be used and structural changes may be made as desired by those skilled in the art without departing from the present invention, and the purview of the appended claims.

Figure 2:
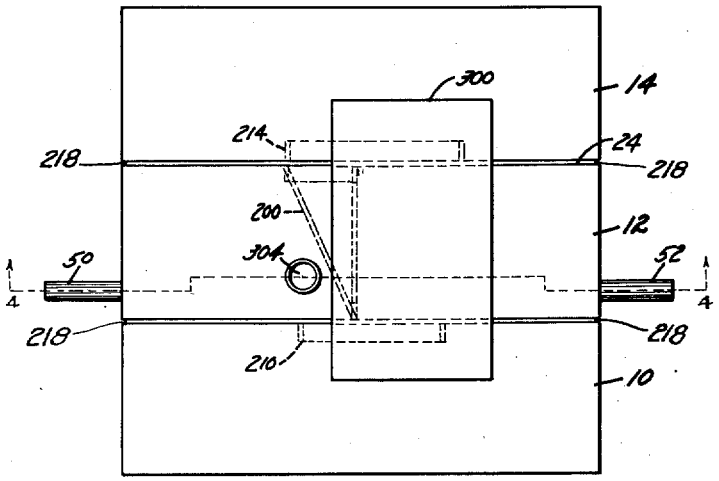
Figure 2 is a side elevation of the furnace shown as seen from the bottom in Figure 1.
Figure 3:
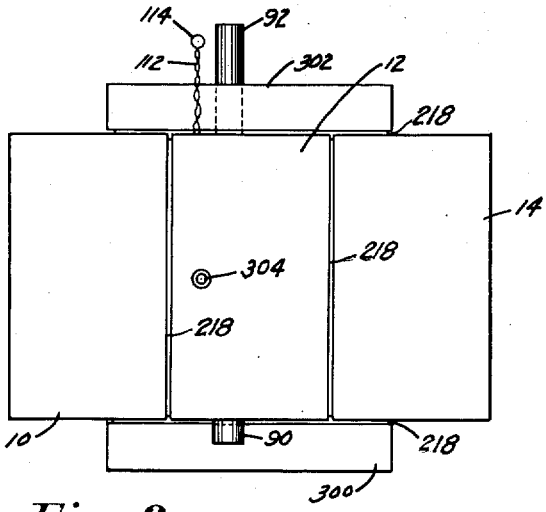
Figure 3 is a view of the furnace as seen from the left hand side in Figure 1.

Referring to Figure 2, it will be seen that the furnace of this invention is preferably formed from a plurality of bricks, preferably three in number as shown at 10, 12 and 14.

The bricks are placed with flat sides against each other and with the upper bricks directly above the lower bricks.

The center brick 12 will be first described. The center brick 12 is provided with a center recess 20 which is of an oblong rectangular shape as seen in top plan view in Figure 5 and which is elongated in parallelism with the length of the brick 12.

The recess 20 can be of any shape in cross section provided it is of sufficient size for its purpose. The recess 20 enters into the center brick 12 from the top face 24 thereof and is for the purpose of receiving members later described.

It will be understood that the bricks 10, 12 and 14 form in a broad sense cover members for the furnace and these members can be made of fire brick, or any other fire proof material of a sufficiently solid nature to form a cover and having the characteristic of not breaking under strain of the expansion and contraction from the heat to be generated in the furnace.

The center housing member 12 has preferably at least four grooves in the face 24, a first two of the grooves 28 and 30 being in alignment with each other and extending into the center cover member 24 from the ends 32 and 34 thereof respectively and extending into and meeting the opposite ends of the center recess 20.

A second two grooves 36 and 38 are provided in the face 24 of the center cover member or brick 12 and extend inwardly from the opposite sides 40 and 42 thereof, joining the center recess 20 at their inner ends.

The purpose of the recess 20 is to receive a hollow housing member 44 which latter can be of a cylindrical shape having a hollow interior 46 which forms a combustion chamber for the furnace. The member 44 must be formed of a suitable material of a fire proof nature and capable of withstanding the extreme heat of a furnace without breaking.

Two elongated annular members 50 and 52 extend from the outer side of the center cover member 12 inwardly through the recesses 28 and 30 respectively into the center of the housing member 44.

The annular members 50 and 52 are in the form of cylindrical tubes preferably and preferably have cylindrically shaped passageways 54 and 56 therethrough respectively. The tubes 50 and 52 are spaced apart at their inner ends a short distance, the distance between them shall be referred to as a carbon deposit space 60.

In the use of the furnace carbon deposit resistors are formed by passing ceramic resistor rods through the outer end of the tube 50, through the tube 50, through the space 60, then out through the tube 52. As the ceramic rods pass through the space 60 they are covered with a carbon deposit by means to be later described.

The outer end of the tube 50 is chamfered as seen at 66 and on the inner wall thereof so as to more easily receive ceramic resistor rods, which are the ceramic blanks from which the resistors are formed. Similarly, the inner end of the tube 52 is chamfered as best seen at 68 on the inner wall thereof so as to more easily receive the resistor rods and to guide them into tube 52 from the space 60.

Suitable means is provided for sealing the ends of the cylindrical housing 44 so as to fill the spaces between the tubes 50 and 52 and the outer cylindrical wall of the housing 44. Such means can comprise a suitable filler member 70 held in place by cement 72 at each of its ends and bonding the filler 70 to the housing 20 and to the adjacent tubes 50 and 52.

Two further tubular members 90 and 92 are disposed in recesses 36 and 38 respectively. The members 90 and 92 can also be referred to as elongated annular members and preferably have cylindrical outer walls and cylindrical inner passages 94 and 96 therethrough. The tubes 90 and 92 extend from the outer side of the center cover member or brick 12 inwardly to the housing member 20 and are fixed by suitable means 98 to the housing member 44 at openings 100 and 102 therein, whereby the tubes 90 and 92 lead directly into the interior of the housing 44.

A heating unit 110, is coiled about the housing member 44 and means are provided at its ends for connecting the coil to a source of electric current. Such means include two leadin wires 112 which have two parts twisted together terminating in loops 114 at their outer ends. The twisted leads 112 are disposed through suitable elongated leadin channels 120 which connect the outer side of the brick 42 with the center recess 20. The channels 120 open upon and are accessible to the upper surface of the center brick 12.

The inner ends of the wires 112 have portions extending axially with respect to the elongated cylindrical housing member 44 and turning outwardly from the remainder of the twisted wires 112 respectively so as to overlap the respective ends of the housing 44 a short distance. At their outer ends the inner portions of the wires 112 are attached to wires 123 as indicated at 125.

The wires 123 extend axially of the housing 44 and inwardly to the respective ends of the coiled heating unit 110. Suitable material 124 is provided for holding the wires 123 and 112 in place against the housing 44 until cement is later placed therearound. This can be a tape 124.

The coil 110 is placed on the housing 44 in such a way that its coils are equidistantly spaced apart with the exception of the coils indicated at 130 and 132. These coils are spaced apart an extra distance opposite an opening 140 which extends from the side 42 of the brick 12 inwardy to the recess 20 for the purpose of permitting the insertion therethrough of a thermo-couple for measuring the temperature on the interior of the furnace and between the coils 130 and 132.

Cement 134 is placed around the coil 110 and around the ends of the housing 44 for the purpose of holding the heating coil 110 in place.

In manufacture the assembly, including the leadin wires 112, the housing 44, the tubes 90 and 92, and the tubes 50 and 52, is placed in the recess 20 and in the corresponding connected grooves, etc. Then cement is added at the ends of the housing 44 as best seen at 142. The cement 142 is fixed only at the ends of the housing 44, leaving the center portion of the recess 20 uncemented and empty or otherwise filled with a loose filling material 143 of a type permitting the expansion and contraction of the coil 110 and the center portion of the housing 44 with the attachment to the walls of the recess 20 so as to prevent breakage by free floating.

The cement portions 142 terminate at their outer ends a short distance beyond the outer ends of the leads 123 or ends of the coil. Beyond this point a filling or rock wool or other suitable material is used at 160 to permit expansion and contraction while the rock wool 160 is held in place by the cement filling 170 disposed around the outer side of each of the tubes 50 and 52 and bonding the tubes to the adjacent wall of the respective grooves 28 and 30.

The tubular members 90 and 92 are similarly provided with rock wool at 154, disposed outwardly of the cement 142 which terminates adjacent the inner end of the wall of the grooves 36 and 38, the rock wool extending to within a short distance of the outer surfaces of the center brick 12. The outer end portions of the grooves 36 and 38 are filled by a cement 172 similarly to a cement 170.

In identical manner the channels 120 which receive the lead-in wires 112 are filled in the center portions with rock wool 180 and are cemented at their outer ends with suitable cement at 182. As just described it will be seen that the only opening into the furnace which is unfilled is the opening 140 for the insertion of the thermo-couple.

The bricks 10, 12 and 14 are slotted in a manner now to be described for improving their expansion and contraction characteristics so as to avoid likelihood of cracking.

For this purpose the center brick 12 is provided with an expansion groove extending a short distance into the surface thereof as shown at 200. The groove 200 is disposed extending in a straight line across the largest portion of the surface of the brick on those sides which face the bricks 10 and 14. The groove 200 may be described as disposed in a plane extending at an angle with respect to a plane disposed at a right angle with respect to the length of the brick 12. This angle is preferably very slight.

As thus described it will be seen that the groove 200 enters the brick 12 a short distance from the opposite side of the thermo-couple opening 140 from the tube 92 across the brick 12 to a point slightly toward the center of the brick from the groove 36 near the tube 90.

The depth of the groove 200 can vary and the depth shown in the drawings is a depth of approximately one-third the size of the width of the center recess 20 and slightly greater than the diameter of the tubes 90 and 92.

Figure 1:
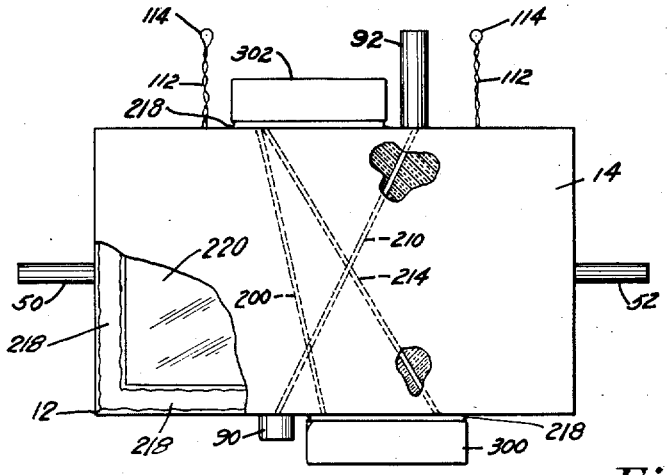
Figure 1 is a top plan view of the furnace showing the portions cut away to show slots in the interior thereof.

The bricks 10 and 14 are provided with grooves of a similar depth on their inner faces disposed adjacent the brick 12. The groove 210 in the brick 10 extends transversely with respect to the groove 200 and is at a much greater angle with respect to a plane extending transversely through the respective bricks. The groove 210, as best seen in Figure 1 extends from a point adjacent tube 90 to a point adjacent the tube 92. The upper brick 14 has a groove 214 which is of a similar depth to the grooves 200 and 210, the groove 214 extending transversely with respect to the groove 210 and crossing the groove 210 adjacent the center of the brick assembly as best seen in top plan view in Figure 1 in dotted lines.

The groove 214 extends from a point opposite the tube 92, that is, on the other side of the brick 14 from the tube 92 as seen in top plan view, to another point approximately opposite the tube 90, that is, on the opposite side of the brick 14 as seen in top plan view from the tube 90.

The bricks are secured together by placing a high temperature flexible bonding material 218 therebetween, which fills the joint between the bricks so that from the outside view it is completely filled. This flexible coating is placed only around the perimeter of each brick. Between the bricks and inside of the perimetrical arrangement of the bonding material are flat layers of asbestos 220 which are rather thin and serve the purpose of permitting the bricks to slide one over the other more freely during expansion and contraction.

Figure 4:
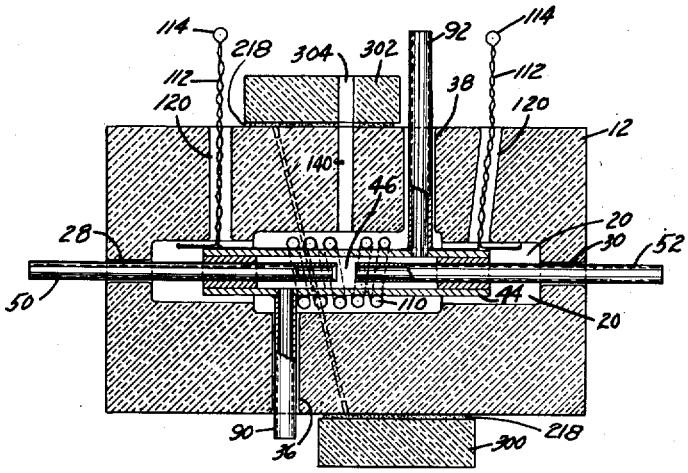
Figure 4 is a view of the furnace taken along the lines 4—4 in Figure 2.
Figure 5:
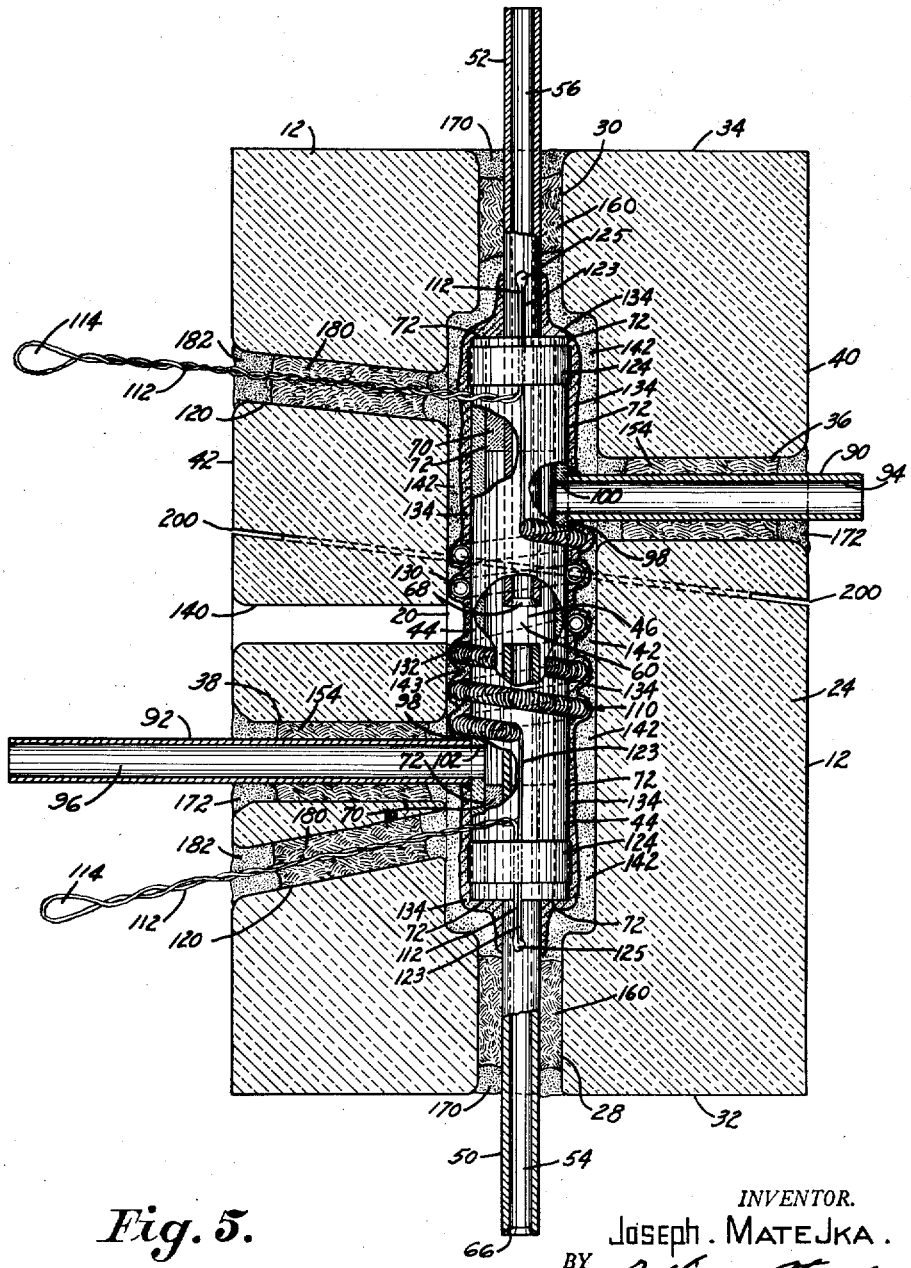
Figure 5 is an enlarged detail of the furnace as seen along the line 4—4 but showing parts and cement in place, these not appearing in Figure 4.

Further strength is added to the assembly through the addition of two side members 300 and 302 as best seen in Figures 1 to 4 and not shown in Figure 5. The side members are preferably formed of a fire brick type of material similarly to the bricks 10, 12 and 14 and are each of a length sufficient to extend transveresly across the furnace sufficiently to overlap the bottom and top bricks a short distance. The side members 300 and 302 are fixed to the bricks 10, 12 and 14 by a high temperature flexible bonding material 218 which hardens into a resilient bond.

One of the side members 300 is disposed on the tube 90 side of the furnace and the other side member 302 is disposed on the tube 92 side of the furnace, the side member 302 having an opening 304 therethrough best seen in Figure 4 which is disposed in registry with the opening 140 whereby a thermo-couple can be placed through the opening 304 and the opening 340.

It will be seen that the side members 300 and 302 cover the exterior of most of the previously described recesses with the exception of the ends of the recess 210 and these ends are filled with suitable material, preferably high temperature flexible bonding material of a resilient nature.

In operation it will be seen that resistor blanks formed of ceramic material and commonly called resistor rods are caused to enter the tube 50 by means not shown in such quantities that the tube 50 is filled with resistor rods each pushing the one ahead of it forward into the furnace. As the rods pass into the heating center of the furnace, they are protected by the tube 50 from carbon deposit until such time as they pass outwardly of the inner end of the tube 50.

While passing between the tube 50 and the tube 52 the rods are coated with a carbon deposit and then pass outwardly of the furnace through the tube 52.

This carbon deposit is even and can be regulated to a degree heretofore impossible.

The carbon deposit is placed on the resistor rods by gases entering the furnace through the tube 92 and leaving the furnace through the tube 90. The gas used is of hydrocarbon type such that in its cracking a carbon deposit is placed on the ceramic rod. The construction of the furnace is such that the gas is almost completely cracked by the time it leaves the furnace through the tube 90, this complete cracking making possible a thicker carbon coating.

I claim:

1. A carbon depositing furnace comprising three cover members of a fireproof nature disposed with two outer members disposed on opposite sides of a center member, said center cover member having a recess extending into a side facing one of said outer members, said center cover member also having at least four grooves in said side connecting the outside of said center member with said recess, a first two of said grooves being in alignment and extending into said center member from opposite sides thereof, the second two of said grooves being disposed entering said recess at points spaced apart substantially each closer to a different one of said first two grooves, a housing member having a hollow chamber therein for receiving gas to be burned, a first two elongated annular members disposed in said first two grooves respectively and extending from the respective outer sides of said center member inwardly through and into said housing member, said annular members having elongated interior openings disposed in alignment, the inner ends of said annular members being spaced apart a certain distance less than the length of a resistor rod for the carbon coating of a resistor rod passing through said annular members between said annular members when desired fuel is placed in one of said annular members, means closing the housing member around said annular members, an electrical heating element disposed around said housing in said recess, means for connecting said heating element to a power source, a second pair of annular members disposed one in each of said second two grooves and leading from the outside of said center member to said housing member, each respectively to one of two spaced apart points therein disposed on opposite sides of the inner ends of said first two annular members, and means filling in said recess and grooves around the members therein.

2. The construction defined in claim 1 in which said center member has a groove extending a short distance into its exterior near the inner ends of said annular members and around its exterior at an inclination to said first two annular members.

3. The construction defined in claim 1 in which said center member has a groove extending a short distance into its exterior near the inner ends of said annular members and around its exterior at an inclination to said first two annular members, said outer members each having a groove extending a short distance into their exterior at the inwardly disposed sides thereof respectively, said outer member grooves being disposed at an inclination with respect to said first two annular members and transversely of each other.

4. The construction defined in claim 1 in which the inner end of one of said first two annular members is chamfered for guiding resistor rods into it.

5. The construction defined in claim 1 in which said housing and said annular members are separated from the respective cover members by a fireproof flexible packing permitting heat expansion and contraction without breakage.

6. A carbon deposit furnace comprising: a fireproof covering having a cracking chamber therein, means for guiding resistor rods therethrough and shielding said rods from carbon depositing gases except during passage through a short carbon deposit space in said cracking chamber, means for conducting carbon depositing gas into said furnace on one side of said space, means for permitting escape of cracked gases out of said furnace from the other side of said space, and means for heating that area of said furnace which is around said deposit space.]

*7. A carbon deposit furnace comprising; a fireproof covering having a recess therein, means dividing the recess into a cracking chamber and a heating chamber, means for guiding resistor rods through the cracking chamber and shielding said rods from carbon depositing gases except during passage through a short carbon deposit space in said cracking chamber, means for introducing a stream of carbon depositing gas into said cracking chamber generally inwardly toward the axis of said guiding and shielding means on one side of said space, means for permitting escape of cracked gas from the other side of said space, both said means for introducing and permitting escape of the gases being axially removed from the deposit space with respect to the axis of said guiding and shielding means, and means in said heating chamber for heating that area of said furnace which is around said deposit space.*

*8. A carbon deposit furnace comprising; a fireproof covering having a cracking chamber therein, means for guiding resistor rods therethrough and shielding said rods from carbon depositing gases except during passage through a short carbon deposit space in said cracking chamber, means for introducing a stream of carbon depositing gas into said cracking chamber generally inwardly toward the axis of said guiding and shielding means on one side of said space, means for permitting escape of cracked gas from the other side of said space, both said means for introducing and permitting escape of the gases being axially removed from the deposit space with respect to the axis of said guiding and shielding means, and means for heating that area of said furnace which is around said deposit space, a hollow housing member extending around said cracking chamber, said heating means being located around said hollow housing member.*

*9. A carbon deposit furnace comprising a furnace body having a cracking chamber therein, means for guiding resistor rods therethrough and shielding said rods from carbon depositing gases except during passage through a short carbon deposit space in said cracking chamber, means for conducting a stream of carbon depositing gas into said cracking chamber substantially toward the axis of and impinging upon said guiding and shielding means at a point axially displaced from said deposit space along the axis of said guiding and shielding means, means for permitting escape of cracked gases from a point in said cracking chamber axially displaced from said deposit space along the axis of said guiding and shielding means on the side opposite to the point of introduction of the carbon depositing gas, and means for heating said cracking chamber.*

*10. In a furnace, a furnace body having an annular cracking chamber, the inner wall of which is tubular for slidably receiving therethrough material to be coated and having a gap in the tube intermediate the cracking chamber whereby to expose the outer surface of the material to the space of the cracking chamber, means to introduce a stream of carbon depositing gas to said cracking chamber at a point axially offset from the gap substantially toward the axis of and impinging upon said inner tubular wall to enable the gas to move around to all parts of the cracking chamber before arriving at the gap to simultaneously and uniformly cause external coating of the material exposed at the gap, and means for exhausting the spent gas from the cracking chamber at a point displaced axially from the gap along the axis of said tubular wall at the side of the carbon depositing space opposite to the gas inlet point.*

*11. In a furnace, inner and outer tubes defining an annular cracking chamber therebetween with the inner tube serving as a passage for the feeding movement through the furnace of the articles to be coated, said inner tube having a gap forming a carbon deposit space intermediate the ends of the cracking chamber, means to introduce to an end portion of the cracking chamber a stream of carbon depositing gas at a point axially remote from said space along the axis of said tubes substantially toward and against the external wall of the inner tube angularly to the axis of the inner tube to deflect the incoming gas to envelop the inner tube prior to its arrival at the carbon deposit space through movement axially along the inner tube to effect a uniform carbon deposit about all external parts of the article exposed at said carbon deposit space, and means for exhausting the spent gas from a point axially displaced from said deposit space along the axis of said inner tube to the other end portion of the cracking chamber opposite to the point of gas introduction whereby to permit said gas from the inlet point to flow in an annular mass axially along the tube to and past said deposit space to the gas exhausting point.*

*12. A carbon depositing furnace comprising a furnace body having a recess therein, an inner tube fitted through the recess through which articles are fed, said tube having a gap intermediate the recess through which the outer surfaces of the articles to be coated are exposed, an outer tube extending in spaced relation to the inner tube and having its ends sealed to the inner tube at points at opposite sides of and remote from the gap and forming with the inner tube and gap an annular cracking chamber and forming with the wall of the recess a heating chamber, an electric heating coil wound about the outer tube in the heating chamber and having intermediate convolutions concentric with the gap and end convolutions extending axially of the tubes to substantial distances at opposite ends of the gap, and induction and eduction pipes for a stream of carbonizing gas entering the annular cracking chamber generally toward and impinging upon the outer wall of said inner tube at opposite end portions thereof axially remote from the gap and to the areas circumscribed by the end convolutions of the heating coil whereby before reaching the gap the incoming gas becomes shaped to an annular mass preheated by the end convolutions as it moves axially along the outer surface of said inner tube toward the gap and cracked by the intermediate convolutions at or near the gap to deposit on all circumferentially exposed parts of the articles at the gap a uniform carbon deposit.*

References Cited in the file of this patent or the original patent

UNITED STATES PATENTS

| | | |
|---|---|---|
| 700,808 | Parks | May 27, 1902 |
| 708,898 | Mohr | Sept. 9, 1902 |
| 749,460 | Stevens et al. | Jan. 12, 1904 |
| 1,220,391 | Bacon et al. | Mar. 27, 1917 |
| 1,364,273 | Gerard et al. | Jan. 4, 1921 |
| 1,528,324 | Fischer | Mar. 3, 1925 |
| 1,872,297 | Jakosky | Aug. 16, 1932 |
| 1,941,009 | Jakosky | Dec. 26, 1933 |
| 1,965,059 | Seibt | July 3, 1934 |
| 1,969,478 | Sanders | Aug. 7, 1934 |
| 1,998,060 | Seibt | Apr. 16, 1935 |
| 2,337,679 | Osterberg | Dec. 28, 1943 |
| 2,369,561 | Grisdale | Feb. 13, 1945 |
| 2,527,747 | Lewis et al. | Oct. 31, 1950 |